(12) United States Patent
Emery et al.

(10) Patent No.: US 9,971,116 B2
(45) Date of Patent: May 15, 2018

(54) LASER OPTICAL FIBER TRAY

(71) Applicant: NLIGHT, INC., Vancouver, WA (US)

(72) Inventors: Joseph J. Emery, Vancouver, WA (US);
Aaron Brown, Vancouver, WA (US);
Shelly Lin, Vancouver, WA (US)

(73) Assignee: nLIGHT, Incorporated, Vancouver, WA (US)

( * ) Notice: Subject to any disclaimer, the term of this patent is extended or adjusted under 35 U.S.C. 154(b) by 0 days. days.

(21) Appl. No.: 15/687,072

(22) Filed: Aug. 25, 2017

(65) Prior Publication Data

US 2018/0059351 A1  Mar. 1, 2018

Related U.S. Application Data

(60) Provisional application No. 62/380,260, filed on Aug. 26, 2016.

(51) Int. Cl.
| | | |
|---|---|---|
| *G02B 6/00* | (2006.01) | |
| *G02B 6/44* | (2006.01) | |
| *B23K 26/70* | (2014.01) | |

(52) U.S. Cl.
CPC .......... *G02B 6/4446* (2013.01); *B23K 26/702* (2015.10); *G02B 6/4448* (2013.01); *G02B 6/4457* (2013.01)

(58) Field of Classification Search
CPC .. G02B 6/4452; G02B 6/3897; G02B 6/4471; G02B 6/4454; G02B 6/4455; G02B 6/00
See application file for complete search history.

(56) References Cited

U.S. PATENT DOCUMENTS

| | | | |
|---|---|---|---|
| 6,128,323 A | 10/2000 | Myers et al. | |
| 7,263,265 B2* | 8/2007 | Grubish | G02B 6/445 |
| | | | 385/135 |
| 9,217,834 B2* | 12/2015 | Yoshikawa | G02B 6/42 |
| 2003/0210883 A1 | 11/2003 | Barthel et al. | |
| 2009/0296746 A1 | 12/2009 | Heaton et al. | |

OTHER PUBLICATIONS

International Search Report and Written Opinion for International Patent Application No. PCT/US17/48677, dated Nov. 7, 2017.

* cited by examiner

*Primary Examiner* — Jennifer Doan
(74) *Attorney, Agent, or Firm* — Green, Howard & Mughal LLP.

(57) ABSTRACT

A laser optical fiber tray is generally presented. In some embodiments, the optical fiber tray comprises an enclosure having an opening in a bottom of the enclosure to accept a feeding fiber exiting from a top of a laser system rack, an opening in a side of the enclosure to allow passage of the feeding fiber out of the enclosure, a removable panel to allow access to an interior of the enclosure and two or more coil guides affixed within the interior of the enclosure, the coil guides spaced apart by a distance that defines a minimum diameter for a loop of the feeding fiber to be contained within the enclosure. In some embodiments, the optical fiber tray is mounted to a top panel of the laser system rack. In some embodiments, the optical fiber tray is mounted to a top panel of an external module which is mounted to a top panel of the laser system rack. Other embodiments are also disclosed and claimed.

20 Claims, 9 Drawing Sheets

LASER OPTICAL FIBER TRAY

CLAIM OF PRIORITY

The present application claims priority to U.S. Provisional Application No. 62/380,260 filed on Aug. 26, 2016, and entitled "LASER OPTICAL FIBER TRAY", which is incorporated by reference in its entirety.

BACKGROUND

Lasers are commonly used in materials processing, including cutting, welding, brazing, surface treatment and other applications. Laser systems are offered in many different configurations, or are custom designed, to meet the needs of customers, not only in terms of properties/intensities of light, but also in terms of feeding fiber design and length. Damage to a feeding fiber can be quite costly from both a cost of replacement and a cost of system downtime point of view, as the feeding fiber is generally not easily replaceable. Therefore, there is a need for a laser optical fiber tray that can protect the feeding fiber when not in use and can be adjustable to the length of exposed feeding fiber needed at a given time.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
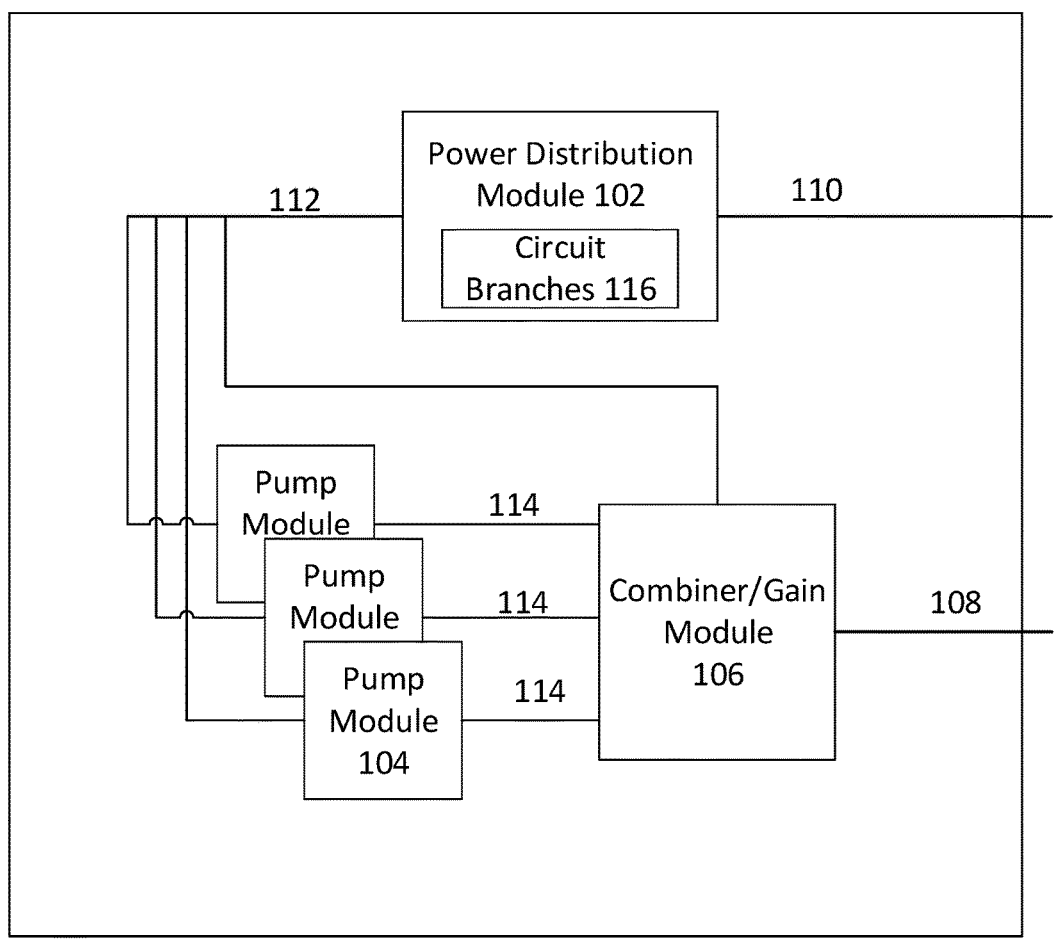
FIG. 1 is a block diagram of an example laser system, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

A laser system generally includes a rack with a plurality of laser modules mounted in the rack to drive light through an optical fiber exiting the system. The exiting fiber, or feeding fiber, can extend dozens of feet in length for inclusion in large material processing tools, for example. Conventionally, the feeding fiber is exposed, and subject to environmental hazards, when not in use. Shipping and relocating of a laser system can be particularly high risk events for the feeding fiber. In some embodiments described hereinafter, the optical fiber tray may include an enclosure to safely coil and store the feeding fiber. In some embodiments described hereinafter, the optical fiber tray may include coil guides that define a minimum diameter for a loop of the feeding fiber to be contained within the enclosure. Also, in some embodiments, one or more external modules may be included between the rack and the optical fiber tray, as described in more detail hereinafter, to further customize properties of the laser beam and/or to provide a connection point where the feeding fiber can be swapped out if necessary.

Some benefits of the laser optical fiber tray and external module described hereinafter include, but are not limited to, enhanced reusability, durability, serviceability, and expandability. For example, the same laser system rack with rack-mounted laser modules can become more standardized with customizations added (after initial delivery and use in some cases) to an external module or optical fiber tray to create a specific laser system to meet the customer needs potentially in terms of modulation frequency, rise/fall times, beam quality, wavelength, fiber properties and fiber length. This can lead to reduced design time by allowing the same laser system rack to be reused among various product lines without have to increase rack height to accommodate additional modules. Additionally, not only would the feeding fiber be better protected from damage with the use of the optical fiber tray, the use of a coupler in the optical fiber tray or external module can enable the quick replacement of the feeding fiber in the event of damage to the original feeding fiber or in the event of system modification requiring a change to a different feeding fiber.

A block diagram of an example laser system that may benefit from incorporating embodiments of the present invention is depicted in FIG. 1. As shown, laser system 100 includes power distribution module 102, pump modules 104, combiner/gain module 106, exit fiber 108, AC input 110, AC output 112, optical fibers 114, and circuit branches 116. Different and/or additional modules may be included in laser system 100 without deviated from the scope of the present invention. For example, separate or multiple combiner/gain modules may be used. Also, any number of pump modules 104 may be present. In one embodiment, six pump modules are included in laser system 100. Laser system 100 may be a direct diode laser system, a fiber laser system, or any other type of laser system that may benefit from incorporating embodiments of the present invention.

Power distribution module 102 may distribute power in the form of AC Voltage received as AC input 110 to pump modules 104 and combiner/gain module 106 through AC output 112. Circuit branches 116 within power distribution module 102 may include circuit components to branch AC input 110 into multiple independent AC outputs 112. In some embodiments, AC input 110 is 3 phase AC which is distributed through circuit branches 116 as single phase AC outputs 112. In some embodiments, circuit branches 116 may also convert AC Voltage to DC Voltage for use with additional components (not shown) in laser system 100.

Circuit branches 116 may include a circuit breaker, a contactor, a line filter, and/or a terminal block for each AC output 112. The components of circuit branches 116 may be chosen based on the voltage and current requirements of modules 104 and 106. In one embodiment, each of AC outputs 112 provide 480 VAC, though the present invention is not so limited. In some embodiments, AC output 112 may vary by module. For example, AC output 112 may deliver a different voltage or a same voltage at a different amperage to pump module 104 than AC output 112 delivers to combiner/gain module 106.

Circuit branches 116 may be designed to protect modules coupled with AC outputs 112 from damage caused by overcurrent or overload or short circuit. Circuit branches 116 may interrupt current flow through one or more of AC outputs 112 after protective relays detect a fault. Circuit branches 116 may be manually or automatically resettable after a fault. Additionally, circuit branches 116 may attenuate conducted electromagnetic interference (EMI) from AC input 110 to AC outputs 112. Circuit branches 116 may be controlled by software or firmware either internal to or external from laser system 100.

One or more pump modules 104 may be included in laser system 100 to drive light through optical fibers 114. In some embodiments, each of pump module 104 may include a DC power supply to convert AC output 112 into direct current that powers laser diodes. In some embodiments, each of pump module 104 includes one or more liquid-cooled coldplate(s) for heat dissipation.

Combiner/gain module 106 may include coiled fiber to increase light output and may combine optical fibers 114 into a single exit fiber 108 that exits laser system 100. Additional modules (not shown) may be included in laser system 100 to control and/or condition the light driven through exit fiber 108 when laser system 100 is operating.

Exit fiber 108 may have any diameter and length. In one embodiment, exit fiber 108 is up to 75 feet in length. Exit fiber 108 may be a single length of fiber or may be multiple lengths of fiber coupled together. In some embodiments, a first shorter exit fiber 108 is coupled with a coupler or other optical product which is coupled with a second longer fiber. Additionally, in some embodiments exit fiber 108 may be single clad while in some embodiments exit fiber 108 may be double clad.

Figure 2:
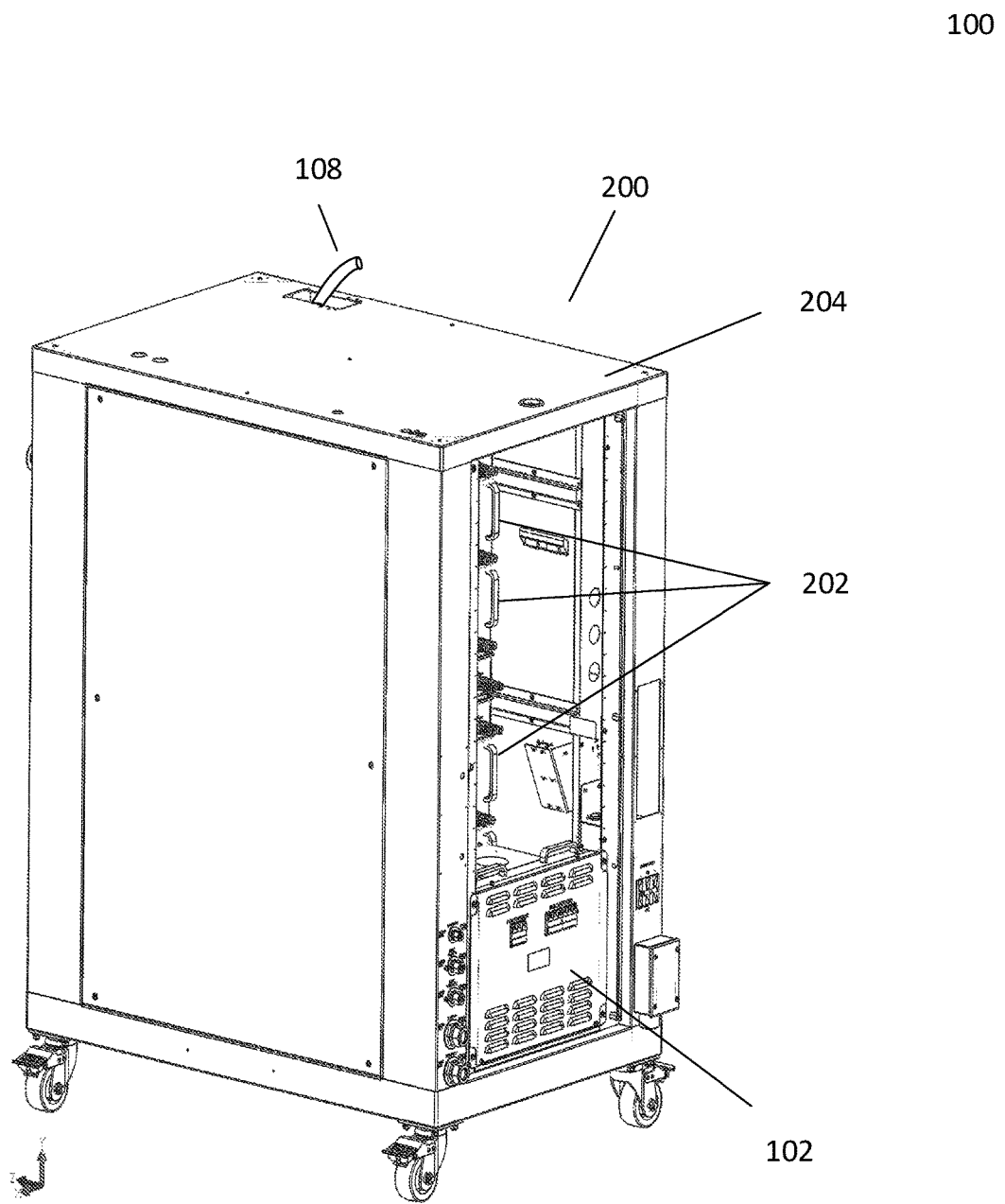
FIG. 2 is a 3D drawing of an example laser system, in accordance with some embodiments.

Turning now to FIG. 2, a 3D drawing of an example laser system, in accordance with some embodiments, is shown. Laser system 100 may include rack 200, power distribution module 102, exit fiber 108, laser modules 202, and rack top panel 204. Rack 200 may provide the structure and mounting points for supporting and containing the various modules of laser system 100. Rack 200 may be of standard or non-standard dimensions. Rack 200 may include additional elements not shown or may be implemented without all elements shown (for example wheels). Rack top panel 204 may include openings and features, as described in more detail hereinafter, to enable aspects of a laser optical fiber tray.

In some embodiments, rack 200 includes a 23-inch standardized rack frame for mounting laser modules 202. In some embodiments, rack 200 includes a 19-in standardized rack frame. In other embodiments, different rack widths may be used. In some embodiments the height of rack 200 is standardized in multiples of 1.752 inches or one rack unit or U. In one embodiment, rack 200 is 28 U tall. In other embodiments different rack heights may be used. In some embodiments, rack 200 is a four vertical post rack that allows for mounting rails to support laser modules 202 at the front and rear. In other embodiments, rack 200 is a two vertical post rack. In some embodiments, rack 200 is open in construction, while in other embodiments rack 200 is enclosed, for example by doors, side panels and a top.

Rack 200 may have provisions for airflow and cooling of laser modules 202. In some embodiments, front and/or side air intakes are included as well as rear exhaust. Forced air fan cooling may or may not be included. In some embodiments, liquid cooling is provided to each of laser modules 202 in the form of cold plates supported by conduit, pumps, liquid inlets, liquid outlets, and drains.

Power distribution module 102 and laser modules 202 (which may include pump module 104 and combiner/gain module 106) are mounted within rack 200. Power distribution module 102 may have both AC and DC outputs.

Exit fiber 108 may exit laser system 100 through an opening in rack top panel 204. Exit fiber 108 may include many feet of optical fiber to interface with external tools (not shown). Conventionally, laser system 100 may be shipped or stored with exit fiber 108 laying on rack top panel 204 exposed to the environment without protection or containment. In some cases, a cardboard box may be used conventionally to provide a measure of packaging.

Figure 3:
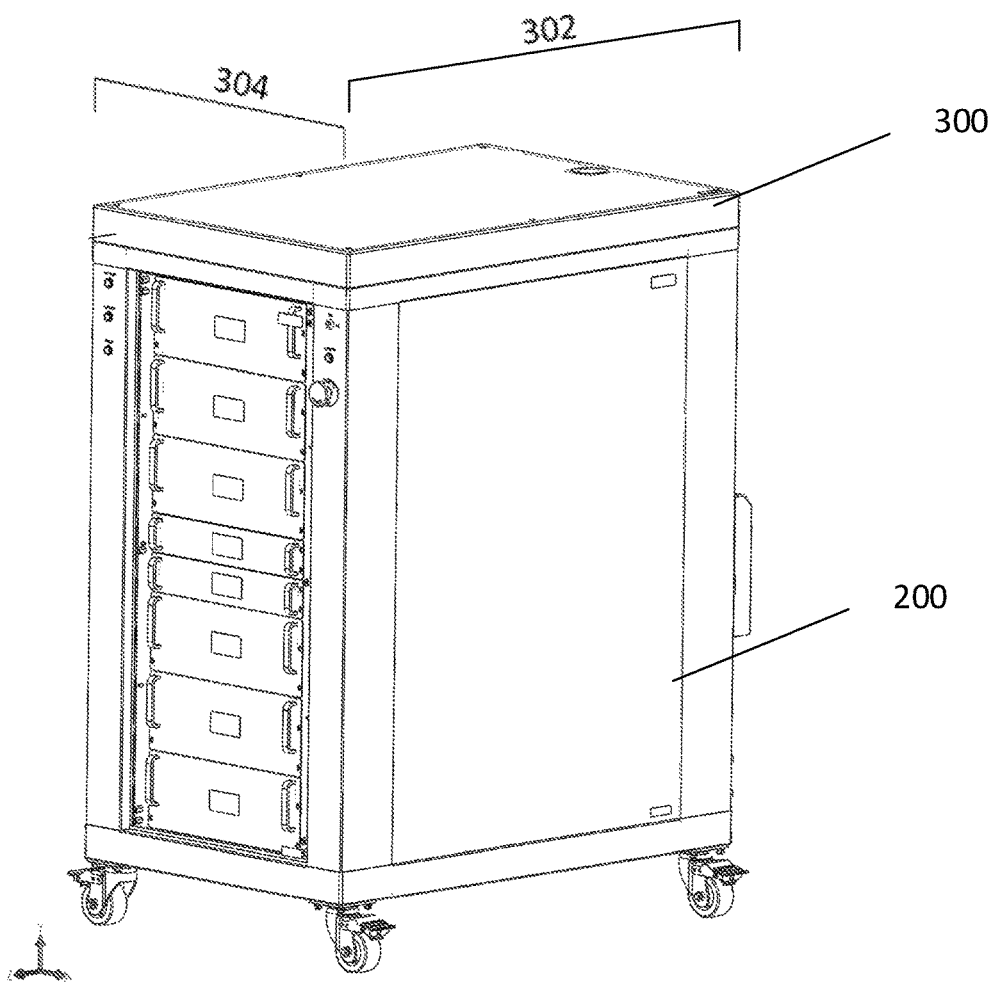
FIG. 3 is a 3D drawing of an example laser system including an optical fiber tray, in accordance with some embodiments.

FIG. 3 is a 3D drawing of an example laser system including an optical fiber tray, in accordance with some embodiments. As shown, laser system 100 may include rack 200, optical fiber tray 300, depth 302 and width 304. Optical fiber tray 300 may be seated on, and interface with rack top panel 204. Some of the ways in which optical fiber tray 300 and rack 200 may interface are described in more detail herein, for example with reference to FIGS. 5, 6, 7 and 8.

In some embodiments, optical fiber tray 300 is made of steel or other metals. In some embodiments, the enclosure of optical fiber tray 300 is made of the same material and thickness as rack 200. One skilled in the art would appreciate that based at least on the materials used, optical fiber tray 300 can provide a relatively strong and durable enclosure to protect the feeding fiber from many common environmental hazards associated with shipping and storage.

As shown, optical fiber tray 300 and rack 200 may be substantially equal in both depth 302 and width 304. One skilled in the art would appreciate that by being substantially equal in two dimensions, not only may manufacturers be able to offer an aesthetically pleasing laser system 100, but they would also be able to maximize the volume within optical fiber tray 300 to hold feeding fiber, and potentially other components, while limiting the height of optical fiber tray 300. However, in some embodiments, optical fiber tray 300 may only be substantially equal with rack 200 in one of depth 302 or width 304, but not both dimensions. In other embodiments, optical fiber tray 300 is not substantially equal with rack 200 in either depth 302 or width 304.

Figure 4:
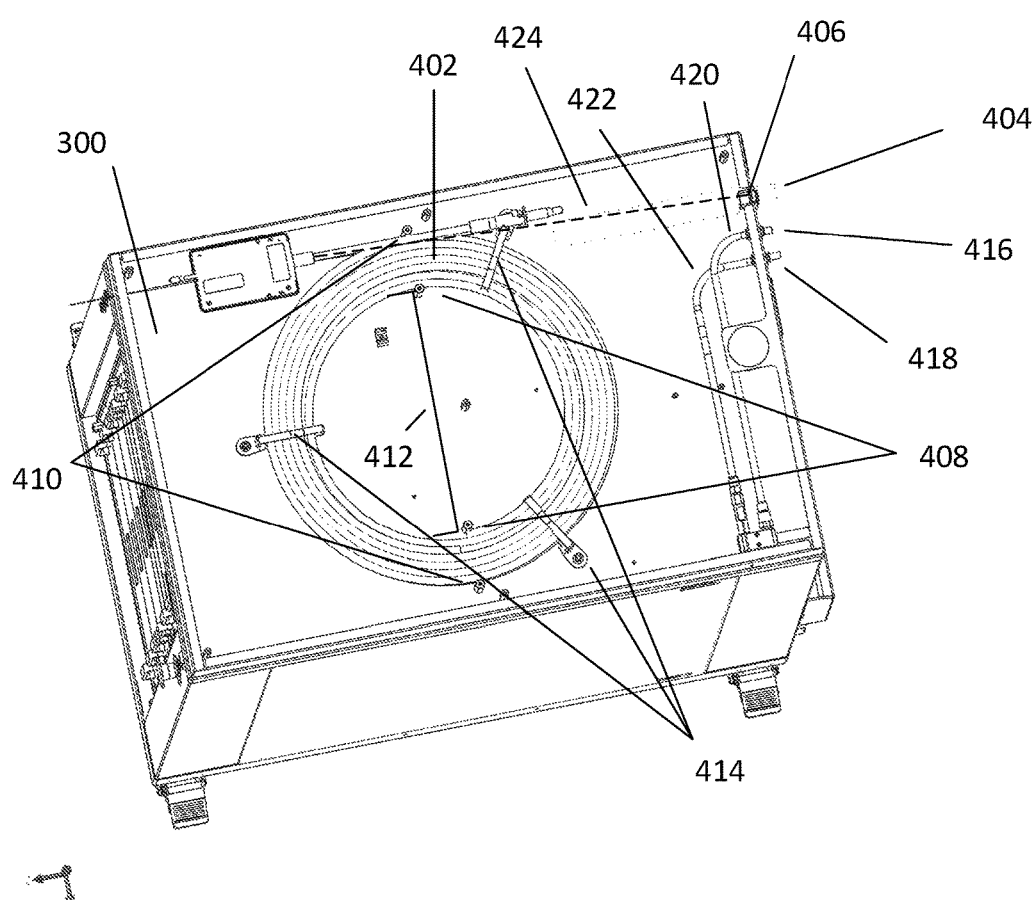
FIG. 4 is an overhead drawing showing the interior of an example optical fiber tray, in accordance with some embodiments.

FIG. 4 is an overhead drawing showing the interior of an example optical fiber tray, in accordance with some embodiments. As shown, the interior of optical fiber tray 300 may include feeding fiber 402, side fiber opening 404, split bushing 406, inner coil guides 408, outer coil guides 410, minimum coil diameter 412, ties 414, liquid supply port 416, liquid return port 418, liquid supply conduit 420, and liquid return conduit 422. Optical fiber tray 300 would include a top panel in most embodiments that would need to be removed to access the interior of optical fiber tray 300, however it is not shown in this figure.

Side fiber opening 404 in optical fiber tray 300 may allow passage of feeding fiber 402 out of the enclosure. In some embodiments the size of side fiber opening 404 allows for passage of feeding fiber 402 as well as attachments to an end of feeding fiber 402. In some embodiments, when laser system 100 is not in use, the entire length of feeding fiber 402 can be contained within optical fiber tray 300. In other embodiments, when laser system 100 is not in use, a portion of feeding fiber 402 or attachments thereon may remain within side fiber opening 404. In some embodiments, to adjust the length of feeding fiber 402 that extends out of optical fiber tray 300, split bushing 406 must first be removed from side fiber opening 404. Feeding fiber 402 may then be able to be uncoiled and passed through side fiber opening 404 to the extent needed, for example for using laser system 100 with a material processing tool. When the desired length of feeding fiber 402 is outside of optical fiber tray 300, split bushing 406 may then be disposed within side fiber opening 404 to grip feeding fiber 402 and resist further passage of feeding fiber 402 in or out of side fiber opening 404.

In some embodiments, split bushing 406, which may be made of plastic or rubber and may have smooth surfaces to contact feeding fiber 402, may also protect feeding fiber 402 from contacting any edges of optical fiber tray 300 at side fiber opening 404. One skilled in the art would appreciate that by exposing only as much of the length of feeding fiber 402 as is needed for use at a given time to potential environmental hazards outside of optical fiber tray 300, there is less risk to any excess of feeding fiber 402 that isn't being used. Additionally, the length of feeding fiber 402 being used at a given time may be able to be more easily managed and kept under control without bends or loops.

Inner guide posts 408 and outer guide posts 410 may be affixed to the bottom of optical fiber tray 300. Inner guide posts 408 may be spaced apart by a distance that defines minimum coil diameter 412 for a loop of feeding fiber 402 to be contained within optical fiber tray 300. In some embodiments, minimum coil diameter 412 is chosen to be at least a minimum bend radius of feeding fiber 402. In some embodiments, minimum coil diameter 412 is in the range of about 16 to 24 inches. In some embodiments, each of outer guide posts 410 are spaced apart from the nearest inner guide post 408 by a distance sufficient to contain a plurality of concentric loops of feeding fiber 402. In some embodiments, the height of and the distance between the inner guide posts 408 and outer guide posts 410 allow for 75 meters of feeding fiber 402 to be coiled in optical fiber tray 300. While shown as including two pairs of inner guide posts 408 and outer guide posts 410, in some embodiments only one pair or three or more pairs may be used. In some embodiments, only inner guide posts 408 are used. Also, while the pairs of inner and outer posts are shown as positioned at 12 and 6 o'clock, in some embodiments they are at different relative positions, for example at 3 and 9 o'clock. In some embodiments, a straight line from the inlet of feeding fiber 402 into optical fiber tray 300 to side fiber opening 404 bifurcates the distance between one inner and outer guide post pair (depicted in FIG. 4 as line 424 bifurcating the distance between the guide post pair at the 12 o'clock position).

Ties 414 may be included in optical fiber tray 300 to fasten together a plurality of loops of feeding fiber 402. Ties 414 may represent reusable zip ties. In some embodiments, ties 414 may represent hook and loop ties. While shown as including 3 Ties 414, any number of ties may be used. Also, while Ties 414 are shown as positioned at 1, 5 and 9 o'clock, in some embodiments they are at different relative positions, for example at 3, 7 and 11 o'clock.

Liquid supply port 416 and liquid return port 418 may be included on the same side of optical fiber tray 300 as, and may be within a few inches of, side fiber opening 404. When laser system 100 is operating, high amounts of heat may be generated at the end of feeding fiber 402. As such, liquid supply port 416 may interface with external conduit to supply liquid to (and liquid return port 418 may interface with external conduit to return liquid from) a liquid thermal solution, such as a coldplate, to dissipate heat from the end of feeding fiber 402 through a liquid-cooling circuit. Optical fiber tray 300 may include liquid supply conduit 420 and liquid return conduit 422 to extend the liquid-cooling circuit to and from rack 200.

Figure 5:
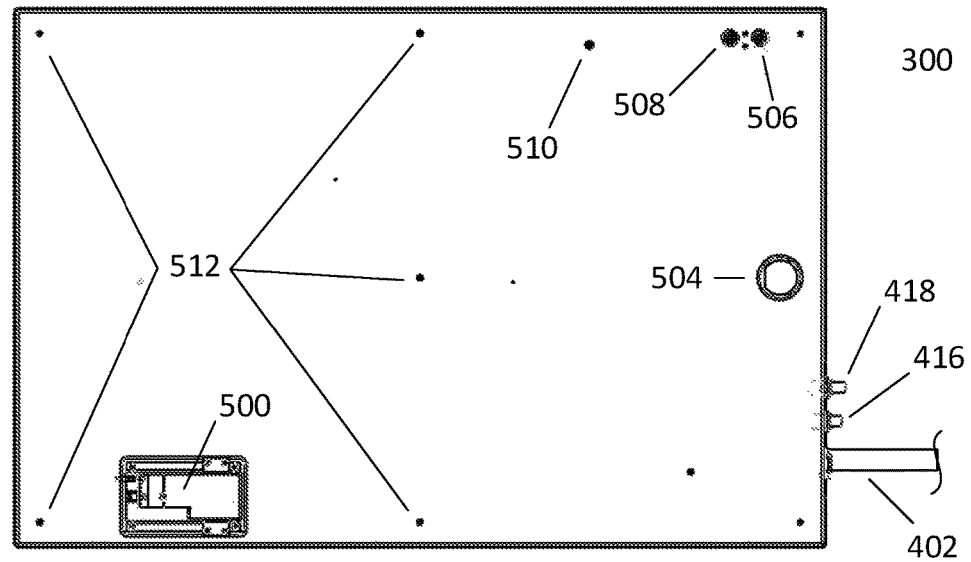
FIG. 5 is a drawing of a bottom of an example optical fiber tray, in accordance with some embodiments.

FIG. 5 is a drawing of a bottom of an example optical fiber tray, in accordance with some embodiments. As shown, the bottom of fiber tray 300 may include bottom fiber opening 500, electrical interface 504, liquid supply port 506, liquid return port 508, drain port 510, and fastener holes 512. In some embodiments, FIG. 5 also represents a bottom of an external module (minus feeding fiber 402, liquid supply port 416, and liquid return port 418).

Bottom fiber opening 500 may accept a feeding (or intermediary) fiber exiting from a top of laser system rack 200. Bottom fiber opening 500 may be rectangular in shape with longer sides oriented in parallel with longer sides of optical fiber tray 300. Bottom fiber opening 500 may include housing that provides a fiber inlet to accept a fiber in a substantially vertical orientation and bend it to a substantially horizontal orientation.

Electrical interface 504 may be part of an electrical circuit to provide power from power distribution module 102 in rack 200 to elements of optical fiber tray 300 by interfacing with electrical contacts on rack top panel 204. While shown as being round, electrical interface 504 may be rectangular or another shape. Electrical interface 504 may be positioned equidistant from the longer sides of optical fiber tray 300.

Liquid supply port 506 and liquid return port 508 may be coupled with liquid supply conduit 420 and liquid return conduit 422, respectively, and may interface with corresponding ports in rack top panel 204. Liquid supply port 506 and liquid return port 508 may be oriented in parallel with, and within one diameter distance from, a longer side of optical fiber tray 300.

Drain port 510 may allow any liquid that may leak from the liquid-cooling circuit within optical fiber tray 300 to drain down into a corresponding opening in rack 200. Drain port 510 may be positioned along the same side of optical fiber tray 300 as liquid supply port 506 and liquid return port 508.

Fastener holes 512 may allow optical fiber tray 300 to be bolted to corresponding fastener holes on rack top panel 204. Fastener holes 512 may be present in each corner of optical fiber tray 300 as well along midway of the longer sides of optical fiber tray 300.

Figure 6:
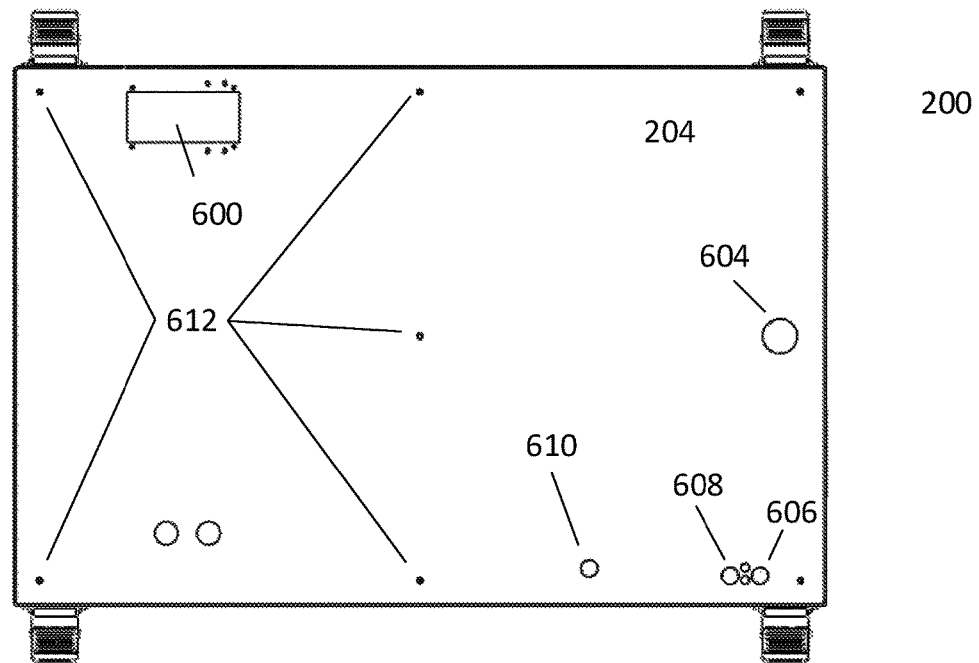
FIG. 6 is a drawing of a top of an example laser rack, in accordance with some embodiments.

FIG. 6 is a drawing of a top of an example laser rack, in accordance with some embodiments. As shown, rack top panel 204 may include fiber opening 600, electrical interface 604, liquid supply 606, liquid return 608, drain 610, and fastener holes 612. In some embodiments, FIG. 6 also represents a top of an external module (minus the wheels).

Fiber opening 600 may allow a fiber to exit rack 200 and transition through bottom fiber opening 500. Fiber opening 600 may be rectangular in shape with its longer sides representing the approximate distance from fiber opening 600 to a side of rack 200 orthogonal to the longer sides.

Electrical interface 604 may be oriented and configured to electrically couple with electrical interface 504 when optical fiber tray 300 is placed on rack 200. Electrical interface 604 include one or more pairs of power and ground connections.

Liquid supply 606 and liquid return 608 may interface with liquid supply port 506 and liquid return port 508, respectively, to exchange water between rack 200 and optical fiber tray 300 as part of a liquid-cooling circuit. Drain 610 may interface with drain port 510 when optical fiber tray 300 is installed on rack 200 to collect any liquid that leaks in optical fiber tray 300.

Fastener holes 612 may form a bolt pattern that aligns with the bolt pattern in the bottom of optical fiber tray 300 so that optical fiber tray 300 can be securely mounted to rack 200 with screws. Fastener holes 612 may be positioned in imaginary lines parallel to shorter sides of rack 200, and 3 fastener holes 612 may be present along such a midway line.

Figure 7:
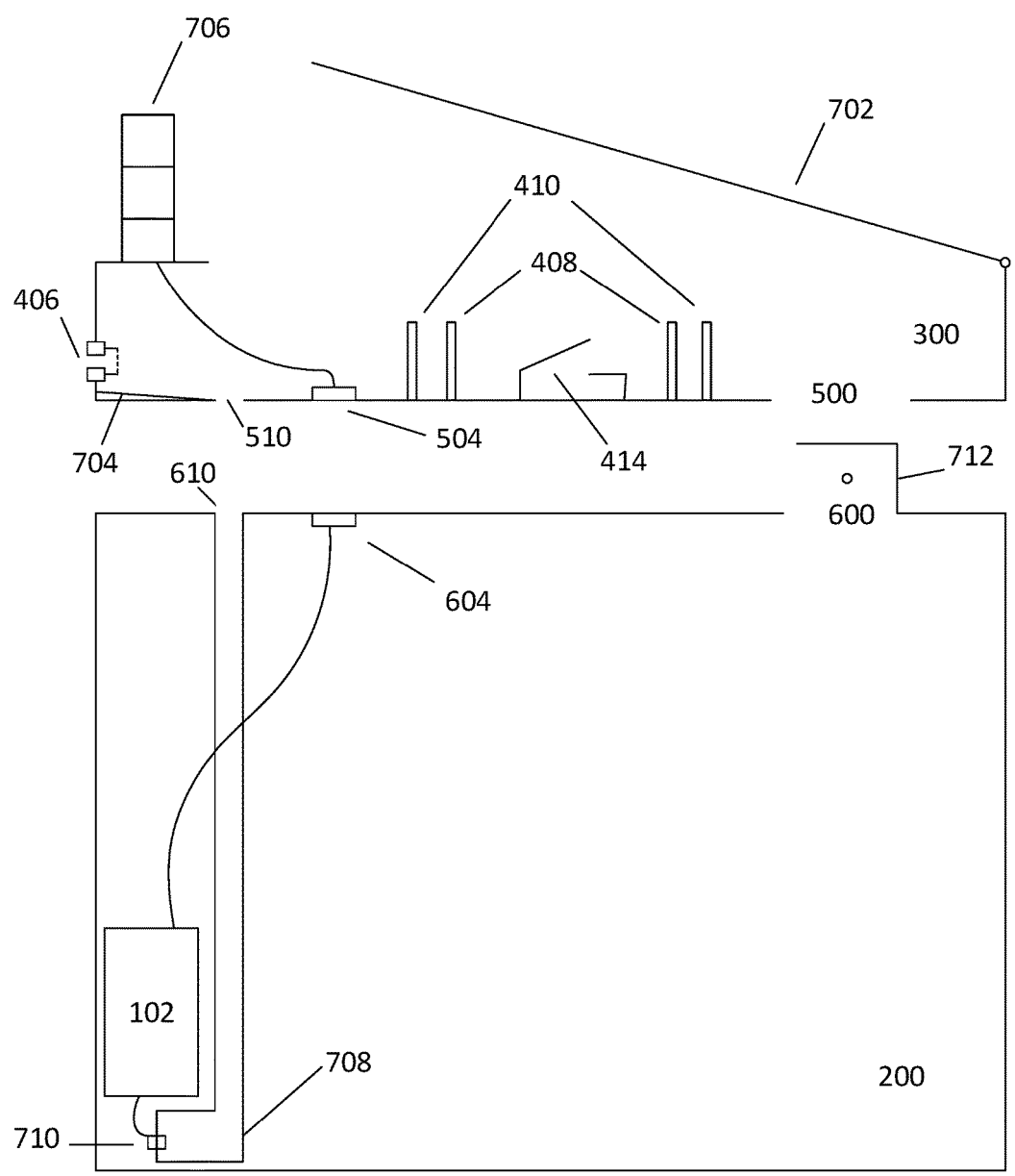
FIG. 7 is a diagram of an example laser system with an optical fiber tray, in accordance with some embodiments.

FIG. 7 is a diagram of an example laser system with an optical fiber tray, in accordance with some embodiments. As shown, rack 200 may include fiber opening 600, fiber housing 712, electrical interface 604, power distribution module 102, drain 610, liquid receptacle 708, and leak detector 710, while optical fiber tray 300 may include removable top 702, bottom fiber opening 500, inner coil guides 408, outer coil guides 410, ties 414, split bushing 406, electrical interface 504, light tower 706, pitched surface 704 and drain port 510.

Optical fiber tray 300 may include removable top 702 to allow access to the interior of the enclosure. Removable top 702 may be hinged or unhinged. In some embodiments, removable top 702 rests on and can be bolted to standoffs (not shown) affixed to the interior bottom of optical fiber tray 300. In some embodiments, inner coil guides 408 and outer coil guides 410 extend high enough to support removable top 702 and also function as standoffs.

Pitched surface 704 may be included in optical fiber tray 300 to direct any liquid that may leak (for example from liquid supply conduit 420 or liquid return conduit 422) toward drain port 510. Pitched surface 704 may extend 360 degrees around drain port 510 similar to a bathtub. Pitch surface 704 may have a constant or variable pitch toward drain port 510. When optical fiber tray 300 is installed on rack 200, drain port 510 would interface with drain 610 to transfer any liquid present through drain conduit to liquid receptacle 708 at or near the bottom of rack 200. As liquid accumulates in liquid receptacle 708, it may be sensed by leak detector 710. Leak detector 710 may electrically and/or communicatively coupled with power distribution module 102 to respond to a detected leak. In some embodiments, a detected leak could cause power distribution module 102 to turn off power to laser modules in rack 200. In some embodiments, a detected leak could cause a warning light to be displayed on light tower 706.

Light tower 706 may be present on top of optical fiber tray 300 to communicate status information about laser system 100. Light tower 706 may include any number and color of lights, perhaps LED lights. In some embodiments, light tower 706 receives DC voltage to operate from power distribution module 102 through electrical couplings with electrical interfaces 504 and 604.

Fiber housing 712 may protrude from the top of rack 200 to guide exit fiber 108 into optical fiber tray 300. Fiber housing 712 may include a cross-support to allow exit fiber 108 to gradually bend from substantially vertical to substantially horizontal. In some embodiments, fiber housing 712 is instead recessed within optical fiber tray 300.

Figure 8:
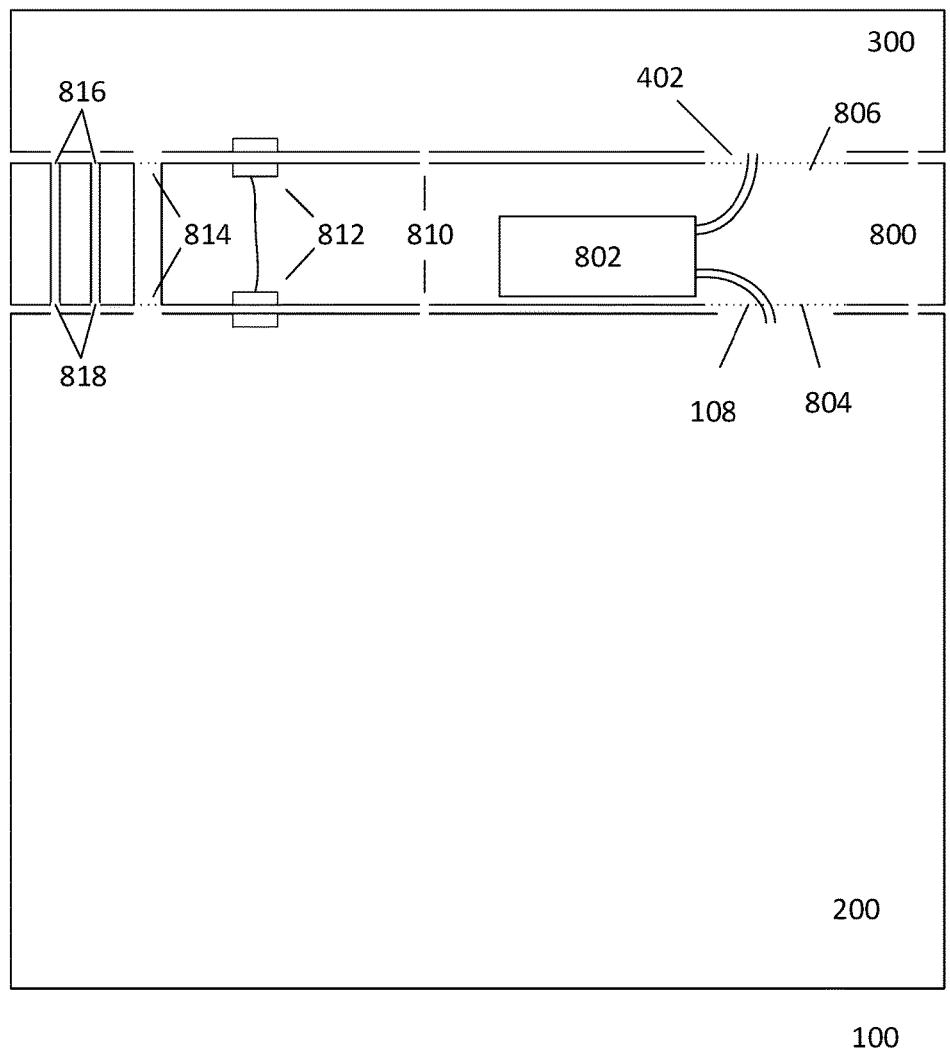
FIG. 8 is a diagram of an example laser system with an external module, in accordance with some embodiments.

FIG. 8 is a diagram of an example laser system with an external module, in accordance with some embodiments. As shown, laser system 100 may include external module 800 which may include coupler 802, bottom opening 804, exit fiber 108, top opening 806, feeding fiber 402, fastener holes 810, electrical interfaces 812, drain openings 814, top liquid connections 816 and bottom liquid connections 818. While shown as including one external module 800, laser system 100 may include two or more external modules 800 of similar or varying complexity. External modules 800 can be inserted in between the rack 200 and optical fiber tray 300 which do various things to the beam characteristics, with optical fiber tray 300 being added to laser system 100 at the end of the optical path. A common interface, as described in reference to FIG. 5 and FIG. 6, at the top of rack 200 mates with either optical fiber tray 300, or any other external module 800. The top of external modules 800 would have the same interface as rack top panel 204, and optical fiber tray 300 mated to the top of them. This approach enables a "plug and play" implementation where an unlimited number of modules that can modify the optical properties of the laser and be placed in the optical path. At the end of the path optical fiber tray 300 manages feeding fiber 402 for customer use.

Coupler 802 may be included in external module 800 to couple exit fiber 108 received from rack 200 through bottom opening 804 with feeding fiber 402 passed to optical fiber tray 300 through top opening 806. Coupler 802 may represent any one or more optical couplers, such as including, but not limited to, a variable beam properties product (vBPP), a fiber-fiber coupler (FFC), or a fiber-fiber switch (FFS). In some embodiments, coupler 802 may be included within optical fiber tray 300. Coupler may be designed to modify properties of light driven through feeding fiber 402 or may pass light through unaltered.

Fastener holes 810 in external module 800 may match with the bolt patterns of fastener holes 512 of optical fiber tray 300 and fastener holes 612 of rack 200, such that external module 800 can be securely mounted in laser system 100. The enclosure of external module 800 may include a removable top to allow access to the interior of the enclosure, for example to couple fibers and install screws.

External module 800 may also include a bathtub-like pitch bottom to direct liquid to the bottom of drain openings 814, which interface with and couple drain port 510 with drain 610. Top liquid connections 816 may interface with and couple liquid supply port 506 and liquid return port 508 through conduit to liquid supply 606 and liquid return 608, respectively, which may interface and couple with bottom liquid connections 818. While shown as bridging the liquid-cooling circuit between rack 200 and optical fiber tray 300, in some embodiments, external module 800 may include branches off of the liquid-cooling circuit, for example directed to a coldplate at coupler 802.

Figure 9:
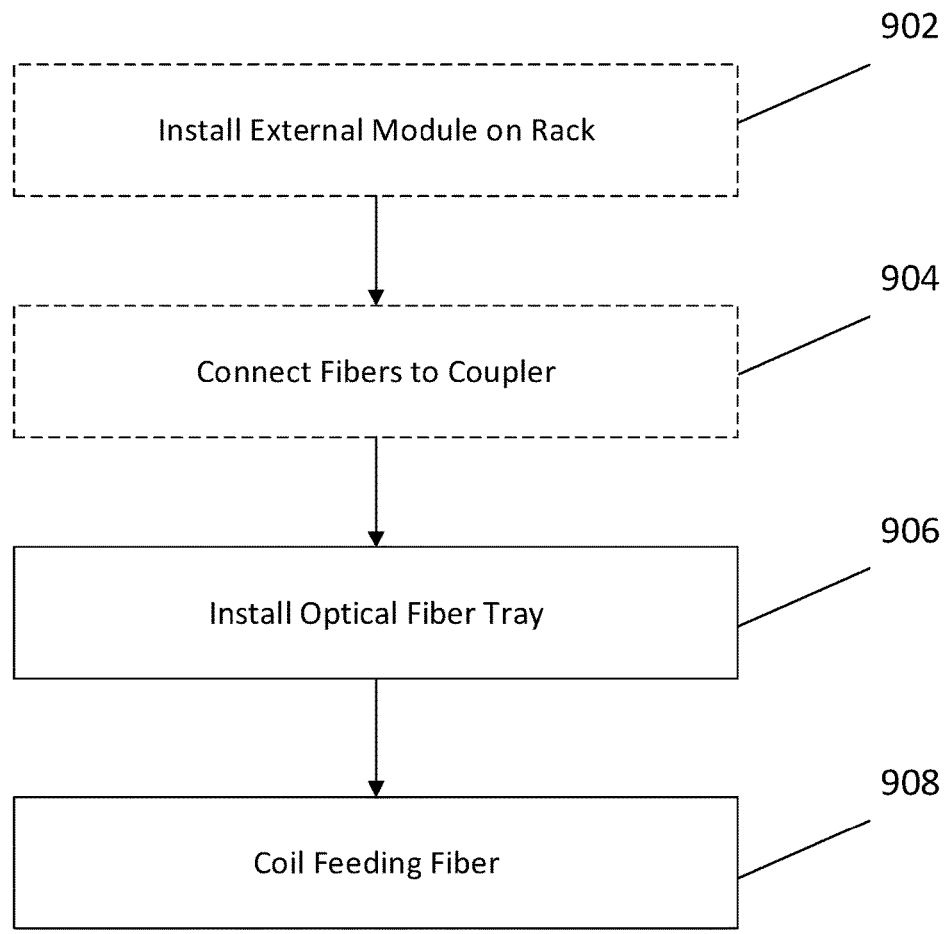
FIG. 9 is a flowchart of an example method of assembling a laser system, in accordance with some embodiments.

A flowchart of an example method of assembling a laser system, in accordance with some embodiments, is shown in FIG. 9. The method begins with installing (902) external module 800, if it is to be used, on rack 200, in some embodiments. A top of external module 800 may be removed to install screws or bolts through fastener holes 810 into fastener holes 612.

The method continues with connecting (904) exit fiber 108, which may be pulled up through fiber opening 600, and feeding fiber 402 to coupler 802, in some embodiments. After the fibers are connecting a top, which may have a bolt pattern matching that of fastener holes 612 of rack top panel 204, may be replaced on external module 800. Additional external modules 800 may be installed in a similar manner.

Next, optical fiber tray 300 is installed (906) on external module 800 (if present as in FIG. 8) or on rack 200 (if external module 800 is not included). Removable top 702 may be removed to access the interior of optical fiber rack 300. Screws or bolts tightened through fastener holes 512 to secure optical fiber rack 300 in place. Feeding fiber 402 may be pulled up through bottom fiber opening 500.

The method concludes with coiling (908) feeding fiber 402 within optical fiber tray 300 between inner coil guides 408 and outer coil guides 410, in some embodiments. The coils of feeding fiber 402 may be held together by one or more of ties 414. Removable top 702 may then be replaced and secured.

Figure 10:
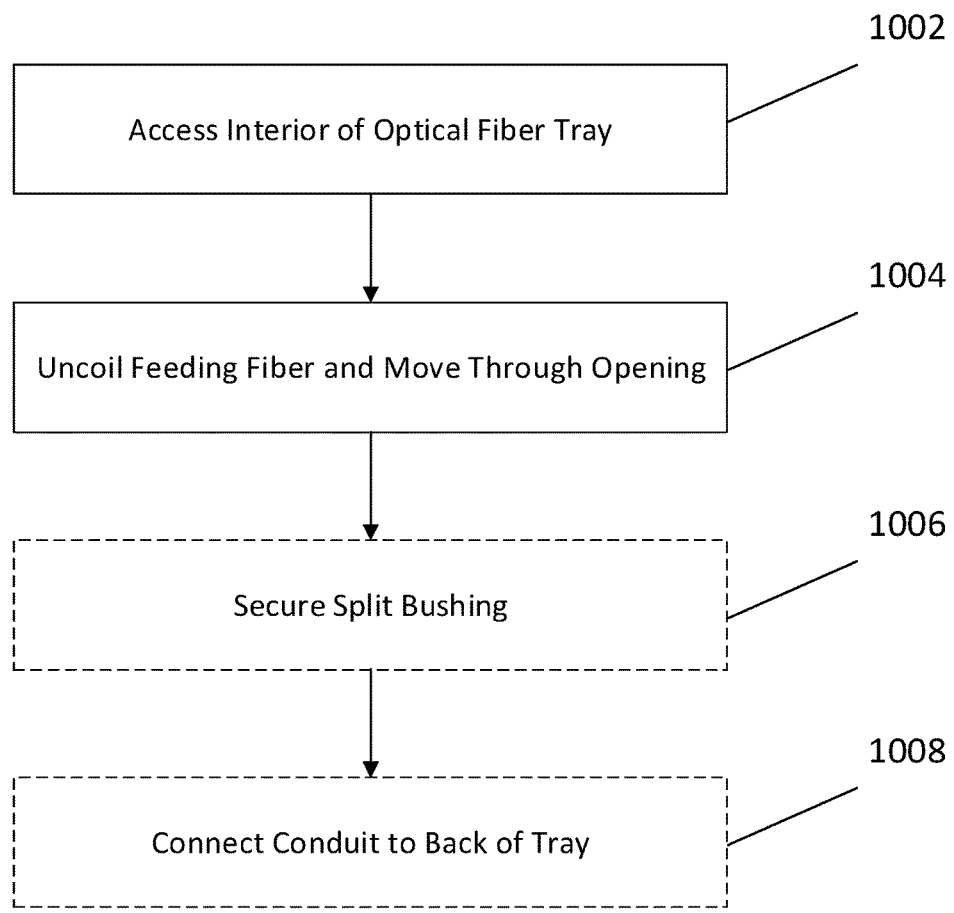
FIG. 10 is a flowchart of an example method of readying a laser system for use, in accordance with some embodiments.

FIG. 10 is a flowchart of an example method of readying a laser system for use, in accordance with some embodiments. The method begins with accessing (1002) the interior of optical fiber tray 300 by removing removable top 702, in some embodiments.

The method continues with uncoiling (1004) and moving feeding fiber 402 out through side fiber opening 404, in some embodiments. In some embodiments, split bushing 406 would need to be removed from side fiber opening 404 to allow access for feeding fiber 402. A number of coils of feeding fiber 402 may be lifted up and over inner coil guides 408 and outer coil guides 410 until the needed length of feeding fiber 402 has been moved out of optical fiber tray 300.

Next, split bushing 406 may be secured (1006) within side fiber opening 404, in some embodiments. Split bushing 406 may include screw-on or snap-on pieces to grip feeding fiber 402 and hinder movement of feeding fiber 402 into or out of side fiber opening 404.

The method concludes with connecting (1008) conduit to liquid supply port 416 and liquid return port 418, in some embodiments. In some embodiments, main liquid supply and return conduits would need to be connected to ports in rack 200 that interface with liquid supply port 416 and liquid return port 418 in optical fiber tray 300.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure. It will be recognized that the invention is not limited to the embodiments so described, but can be practiced with modification and alteration without departing from the scope of the appended claims. The above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An optical fiber tray for a laser system rack, comprising:
    an enclosure;
    an opening in a bottom of the enclosure to accept a feeding fiber exiting from a top of the laser system rack;
    an opening in a side of the enclosure to allow passage of the feeding fiber out of the enclosure;
    a removable panel to allow access to an interior of the enclosure; and
    two of more coil guides affixed within the interior of the enclosure, the coil guides spaced apart by a distance that defines a minimum diameter for a loop of the feeding fiber to be contained within the enclosure.

2. The optical fiber tray of claim 1, wherein the coil guides comprise a pair of inner posts and a pair of outer posts, the inner posts spaced apart by at least twice a minimum bend radius of the feeding fiber and each of the outer posts spaced apart from a nearest one of the inner posts by a distance sufficient to contain a plurality of concentric loops of the feeding fiber.

3. The optical fiber tray of claim 1, further comprising one or more reusable ties affixed within the interior of the enclosure to fasten together a plurality of loops of the feeding fiber.

4. The optical fiber tray of claim 1, wherein the opening in the side of the enclosure comprises a split bushing to grip the feeding fiber while the bushing is disposed within the side of the enclosure.

5. The optical fiber tray of claim 1, further comprising first liquid supply and return ports in the bottom of the enclosure to interface with corresponding second liquid supply and return ports in the top of the laser system rack.

6. The optical fiber tray of claim 5, further comprising liquid supply and return ports in the side of the enclosure to interface with conduit external to the enclosure, a liquid supply conduit extending between the first and second liquid supply ports, and a liquid return conduit extending between the first and second liquid return ports.

7. The optical fiber tray of claim 6, wherein the interior of the enclosure further comprises a surface pitched toward a drain in the bottom of the enclosure, the drain to interface with drain conduit of the laser system rack.

8. The optical fiber tray of claim 1, further comprising an electrical interface in the bottom of the enclosure to contact a corresponding interface in the top of the laser system rack.

9. The optical fiber tray of claim 8, wherein the enclosure further comprises a top light tower electrically coupled with the electrical interface.

10. The optical fiber tray of claim 1, further comprising a fiber coupler to couple the feeding fiber with a second fiber.

11. A laser system, comprising:
a rack, comprising:
a plurality of laser modules mounted in the rack to drive light through an optical fiber exiting the system;
a power distribution module disposed within the rack to distribute input electricity to the laser modules; and
a top panel; and
an optical fiber tray mounted on the top panel of the rack, the optical fiber tray comprising:
an enclosure;
an opening in a bottom of the enclosure to accept a feeding fiber exiting from the top panel of the rack;
an opening in a side of the enclosure to convey the feeding fiber outwardly;
a removable top panel to allow access to an interior of the enclosure; and
two of more coil guides affixed within the interior of the enclosure, the coil guides spaced apart by a distance that defines a minimum diameter for a loop of the feeding fiber to be contained within the enclosure.

12. The laser system of claim 11, wherein the top panel of the rack further comprises a protruding housing to present the feeding fiber to the optical fiber tray substantially horizontally.

13. The laser system of claim 11, further comprising an electrical interface in the top panel of the rack to electrically couple the optical fiber tray with the power distribution module.

14. The laser system of claim 11, further comprising liquid supply and return ports in the top panel of the rack to exchange liquid with the optical fiber tray.

15. The laser system of claim 14, further comprising a drain in the top panel of the rack coupled with a receptacle, and a leak detector in the receptacle to detect the presence of liquid.

16. A laser system, comprising:
a rack, comprising:
a plurality of laser modules mounted in the rack to drive light through an optical fiber exiting the system;
a power distribution module disposed within the rack to distribute input electricity to the laser modules; and
a top panel;
an external module mounted on the top panel of the rack, the external module comprising:
an enclosure;
an opening in a bottom of the enclosure to accept a first fiber exiting from the top panel of the rack;
a coupler to couple the first fiber to a feeding fiber; and
an opening in a top of the enclosure to pass the feeding fiber; and
an optical fiber tray mounted on the top panel of the external module, the optical fiber tray comprising:
an enclosure;
an opening in a bottom of the enclosure to accept the feeding fiber exiting from the top of the external module;
an opening in a side of the enclosure to convey the feeding fiber outwardly;
a removable top panel to allow access to an interior of the enclosure; and
two of more coil guides affixed within the interior of the enclosure, the coil guides spaced apart by a distance that defines a minimum diameter for a loop of the feeding fiber to be contained within the enclosure.

17. The laser system of claim 16, wherein the coupler further comprises a device to modify properties of light driven through the feeding fiber.

18. The laser system of claim 16, wherein the external module enclosure further comprises liquid supply, return and drain ports in the enclosure top and bottom to couple the rack with the optical fiber tray.

19. The laser system of claim 16, wherein the external module enclosure further comprises electrical interfaces in the enclosure top and bottom to electrically couple the rack with the optical fiber tray.

20. The laser system of claim 16, wherein the external module enclosure further comprises a plurality of fastener holes forming a pattern in the enclosure top and bottom, the pattern matching fastener holes in the top of the rack.

* * * * *